(12) United States Patent
Clements

(10) Patent No.: US 7,367,186 B2
(45) Date of Patent: May 6, 2008

(54) WIRELESS TECHNIQUE FOR MICROACTIVATION

(75) Inventor: Ken Clements, Los Gatos, CA (US)

(73) Assignee: Technology Innovations, Inc., Pittsford, NY (US)

( * ) Notice: Subject to any disclaimer, the term of this patent is extended or adjusted under 35 U.S.C. 154(b) by 699 days.

(21) Appl. No.: 10/449,351

(22) Filed: May 30, 2003

(65) Prior Publication Data

US 2008/0072593 A1    Mar. 27, 2008

Related U.S. Application Data

(63) Continuation of application No. 10/058,887, filed on Jan. 28, 2002, now Pat. No. 6,588,208.

(60) Provisional application No. 60/264,741, filed on Jan. 29, 2001.

(51) Int. Cl.
*F01B 29/10*    (2006.01)

(52) U.S. Cl. .......................................... 60/527; 60/528

(58) Field of Classification Search .................. 60/527, 60/528

See application file for complete search history.

(56) References Cited

U.S. PATENT DOCUMENTS

| | | | |
|---|---|---|---|
| 4,864,824 A | 9/1989 | Gabriel et al. | |
| 5,061,914 A | 10/1991 | Busch et al. | |
| 5,271,075 A | 12/1993 | Gfeller et al. | |
| 5,602,386 A | 2/1997 | Neuberger | |
| 5,903,099 A | 5/1999 | Johnson et al. | |
| 6,075,239 A | 6/2000 | Aksyuk et al. | |
| 6,149,742 A * | 11/2000 | Carpenter et al. | 148/563 |
| 6,575,965 B1 | 6/2003 | Fitch et al. | |
| 6,588,208 B1 * | 7/2003 | Clements | 60/527 |
| 6,669,794 B1 * | 12/2003 | Bellouard et al. | 148/563 |

FOREIGN PATENT DOCUMENTS

WO    WO 00/34536    *    6/2000

* cited by examiner

*Primary Examiner*—Hoang Nguyen
(74) *Attorney, Agent, or Firm*—Duane C. Basch; Basch & Nickerson LLP

(57) ABSTRACT

The present invention is a method and apparatus for achieving high work output per unit volume in micro-robotic actuators, and in particular TiNi actuators. Such actuators are attractive as a means of powering nano-robotic movement, and are being developed for manipulation of structures at near the molecular scale. In these very small devices (one micron scale), one means of delivery of energy is by electron beams. Movement of mechanical structures a few microns in extent has been demonstrated in a scanning electron microscope. Results of these and subsequent experiments will be described, with a description of potential structures for fabricating moving a microscopic x-y stage.

4 Claims, 2 Drawing Sheets

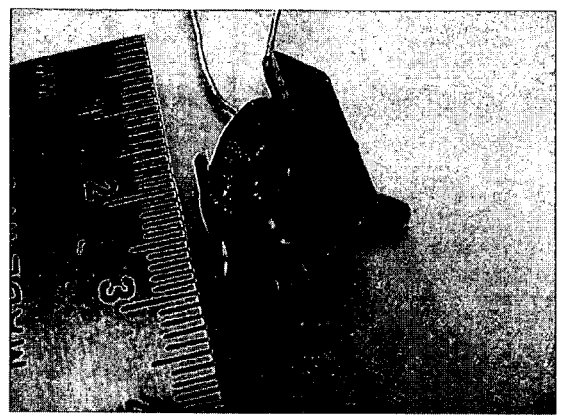
Figure 3
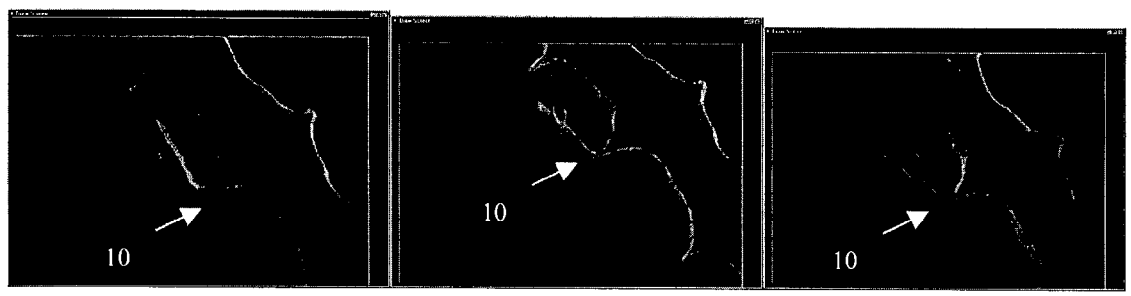
Fig. 4a)          Fig. 4b)          Fig. 4c)
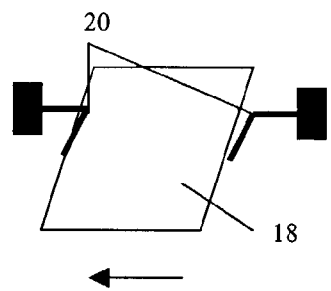 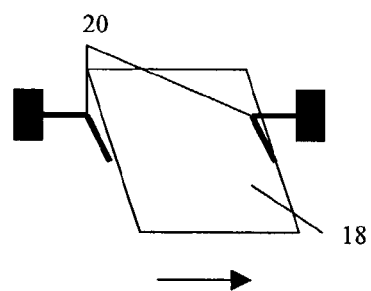
Figure 5a          Figure 5b

WIRELESS TECHNIQUE FOR MICROACTIVATION

This application is a continuation of U.S. patent application Ser. No. 10/058,887 by K. Clements, now U.S. Pat. No. 6,588,208. filed Jan. 28, 2002 for a Wireless Technique for Microactivation," which claims priority from U.S. Provisional Application for patent, Ser. No. 60/264,741, filed Jan. 29, 2001, the contents of which are hereby incorporated by reference in their entirety.

This invention relates generally to production and operation of microactuators by focused beam energy, and more particularly to a wireless technique for both control and energy, as well as the return path for observation and data.

The following related publications are also hereby incorporated by reference for their teachings:

K. Eric Drexler, Engines of Creation: the coming era of nanotechnology, Anchor Doubleday, 1986;

K. Eric Drexler, Nanosystems, Molecular Machinery, Manufacturing, and Computation, John Wiley & Sons, Inc., 1992;

James R. von Ehr, Zyvex "the first nanotechnology development company", http://www.zyvex.com;

M F Yu, M. J. Dyer, G. D. Skidmore, H. W. Rohrs, X K Lu, K. D. Ausman, J. R. Von Ehr, R. S. Ruoff, 3 Dimensional Manipulation of Carbon Nanotubes under a Scanning Electron Microscope, Sixth Foresight Conference 1998;

A. D. Johnson, "Vacuum-Deposited TiNi Shape memory Film: Characterization and Applications in Micro-Devices," J. Micromech. Microeng. 1(1991) 34-41;

P. Krulevitch, A. P. Lee, P. B. Ramsey, J. C. Trevino, J. Hamilton, M. A. Northrup, "Thin film Shape Memory Alloy Microactuators, J. MEMS, vol. 5, No. 4, December 1996 (showing that SMA has the highest work output per unit volume of any actuating technology); and Deepak Srivastava, NASA Ames research Center, Moffeft Field, 650 604 3468 deepak@nasa.gov; private communication to Vikas Galhotra at TiNi Alloy Company.

BACKGROUND AND SUMMARY OF THE INVENTION

In 1982 K. Eric Drexler introduced the idea of assemblers of molecular size in his book "Engines of Creation" (cited above). Nanotechnology is the subject of at least one international conference, and one commercial venture has been organized and funded to invest research and planning in this technology. Although commercial realization of nanotechnology may be years away, there is strong indication that research following the human genome project, and particularly the study of protein structure and function, will require tools to manipulate components of the cell. Development of these tools is a demanding, exciting, and challenging research subject.

Miniaturization of mechanical devices is evolving toward nanometer scale, requiring handling and assembly of objects as small as a few nanometers. Manipulation of samples and specimens smaller than a few microns in size demands a technology that, at present, does not exist. Assemblers are needed that can grip collections of molecules, releasing them from their present location, lifting, rotating, and forcefully placing them in a new environment.

Existing micropositioners do not provide the requisite flexibility of motion for assembly tasks that are contemplated. Forceful shape memory alloy actuators can be scaled to micron size. These devices are thermally powered and so require a source of heat energy: this heat may be supplied by conduction, joule heating, infrared light, or other means. The present invention contemplates the use of a scanning electron microscope beam to provide heat energy to energize thermal actuators. Prototype actuators are fabricated by sputter deposition of titanium-nickel thin film, photolithographic patterning, and chemical milling. A scanning electron beam is positioned to produce local heating, and to observe the resulting motion.

Atomic force microscopy can be used to move individual atoms but not to grip larger objects with enough force to hold against local forces. In recent investigations of the properties of carbon nanotubes, piezoelectric stepper motors have been used to manipulate structures orders of magnitude smaller than the drivers (see MF Yu et al. in "3 Dimensional Manipulation of Carbon Nanotubes under a Scanning Electron Microscope"). Manipulation of objects this small would be improved if the end-effectors were not much larger than the objects they control. In analogy to the shoulder-wrist-finger arrangement of the human hand, gross positioning should be managed by actuators of macroscopic size, and fine control by end-effectors of much smaller size.

The force of actuation should be produced as close as possible to the point of application. This implies that manipulation of sub-micron size objects requires micron-size actuators. Conventional actuators (electromagnetic, piezoelectric) do not scale well to micron size. A promising form of actuation is heat-actuated devices, particularly shape memory actuators. Photolithography provides means of fabricating devices of sub-micron size. Miniature shape memory alloy (SMA) actuators rely on joule heating to cause the phase change. In the sub-micron range it is difficult to make electrical connection, especially on devices that move. To solve this problem, the present invention focuses on the actuation of sub-micron scale shape memory alloy devices by electron-beam excitation.

The present invention is directed to the operation of microactuators by focused beam energy. Whereas microactuators now require wires or tubes attached to get the energy and control signals down to them, this invention discloses a wireless technique for both control and energy, as well as the return path for observation and data.

Current devices are fabricated as small as a few hundred microns using conventional microlithography. Shrinking this technology to sub-micron dimensions has raised at least two questions: (i) Will the shape memory property be preserved when the dimensions are as small or smaller than the crystal domains? And (ii)

How can such small objects (sub-micron) be selectively heated to produce actuation? The present invention, based upon research conducted to answer such questions, provides preliminary proof-of-concept.

In accordance with the present invention, there is provided a method for driving a shape memory alloy actuator, including the steps of: pre-straining a shape memory alloy in its low-temperature state; and subsequently, heating the shape memory alloy above its phase transformation temperature using a focused beam.

One aspect of the invention is based on the discovery of techniques for achieving high work output per unit volume in micro-robotic actuators, and in particular TiNi and similar actuators. Such actuators are attractive as a means of powering nano-robotic movement, and are sitable for manipulation of structures at or near the molecular scale. In these very small devices (one micron scale), one means of delivery of energy is by electron beams. Movement of mechanical structures a few microns in extent has been demonstrated in a scanning electron microscope. Results of these and subsequent experiments will be described, with a description of potential structures for fabricating moving a microscopic x-y stage.

BRIEF DESCRIPTION OF THE DRAWINGS

FIG. 3 is a heated sample holder for a scanning electron microscope in accordance with an aspect of the present invention;

FIGS. 4a-4c are a sequence of images from the SEM showing the results of heating the TiNi specimen by SEM electron beam; and FIGS. 5a and 5b are illustrative schematics of a single-direction platform moved by microactuators in accordance with an aspect of the present invention.

Figure 1:
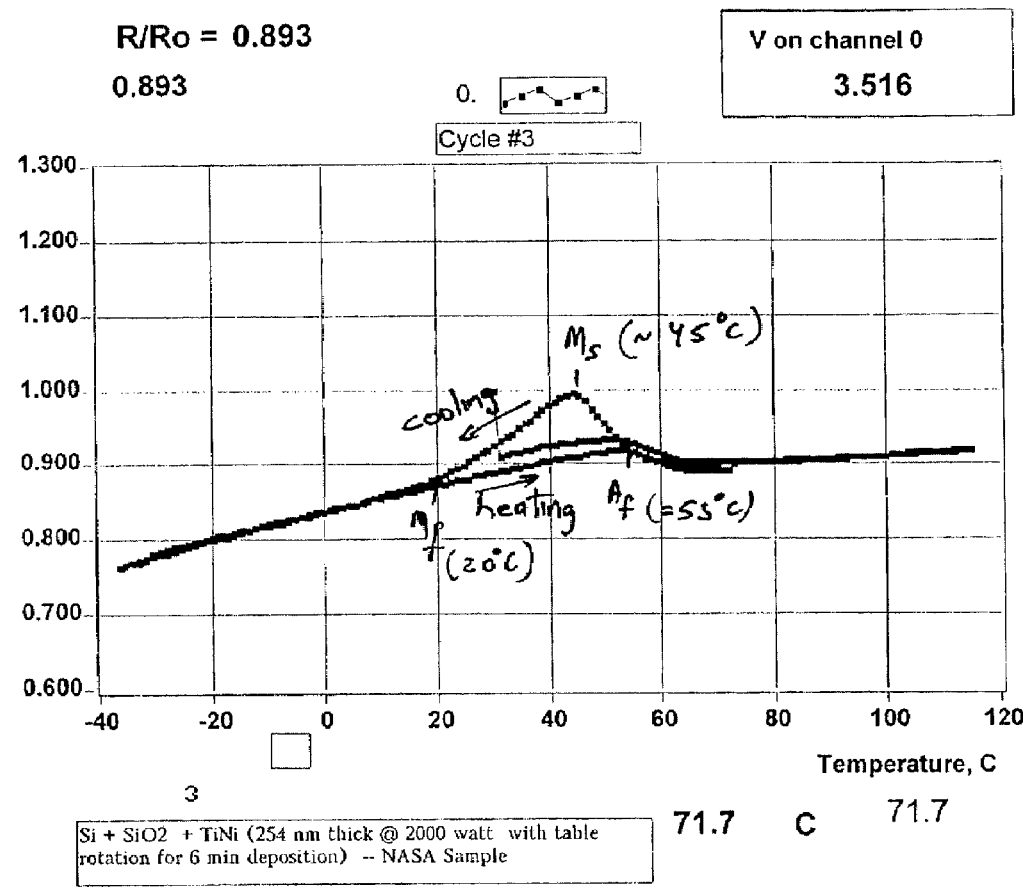
FIG. 1 is a graph of resistivity versus temperature for an exemplary TiNi film sputter-deposited on silicon oxide in accordance with an aspect of the present invention.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by the appended claims.

DESCRIPTION OF THE PREFERRED EMBODIMENT

For a general understanding of the present invention, reference is made to the drawings. In the drawings, like reference numerals have been used throughout to designate identical elements.

As depicted by information in the associated figures, the present invention is directed to the operation of microactuators by focused beam energy. As depicted in the graph of FIG. 1, memory property may be preserved when the dimensions of a device are as small or smaller than the crystal domains. For example, a film approximately 100 nanometers (nm) (about 200 atomic layers) thick was shown to undergo a phase transformation as indicated by a change in resistivity. The change in slope and hysteresis loop are typical for TiNi shape memory alloy (SMA).

As noted herein, a scanning electron microscope electron beam (e-beam) may be used to provide the heat energy, and beam steering can bring a spot of energy a fraction of a micron in diameter to bear on a sample. Therefore, the questions of how much power must be delivered to the sample, and whether the beam can provide this much energy in a short enough time to effect a shape change were addressed.

The estimated energy required to actuate a TiNi specimen 4×10×100 microns by heating it from the room temperature to the transition point is about $1.3 \times 10^{-5}$ joules (DT=~80 C, DH=~25 J/gm, Cp=~0.3 J/gm $^\circ$ C., density=6.4 gm/cm$^3$). The power available from the electron beam is $2 \times 10^{-3}$ watt (for accelerating voltage ~20 KV and beam current ~10–7 A) and the estimated heating time is ~6×10⁻3 sec.

Figure 2:
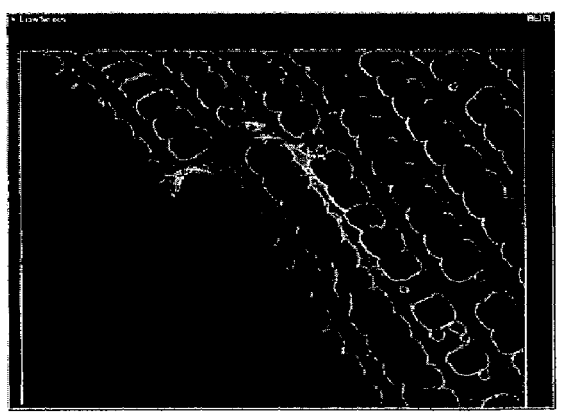
FIG. 2 is a scanning electron beam image of TiNi film with fenestrations.

Demonstration of shape recovery requires that the specimen be pre-strained (stretched, compressed, or bent) while it is in its low-temperature state and then heated above the phase transformation temperature. The sample used was a fragment of TiNi film 4 micrometers thick deposited on silicon oxide, and patterned with fenestrations about 40 microns in diameter, and removed from the substrate. This film was further etched to diminish the width and thickness of the web elements. The resulting Web was torn apart, producing small protrusions about 1-2 micron wide and 20 microns long. Referring to FIG. 2, one such structure is depicted in the micrograph. Some of these were bent during tearing, others were deformed manually using a micromanipulator.

Once the structures were isolated, the specimen was placed on a heated pedestal in an ISI-SS60 scanning electron microscope. The pedestal was equipped with a heater and thermocouple so that the base temperature of the structure could be controlled and measured. An exemplary fixture is depicted in FIG. 3 against a size reference. Fluke instruments were used to record temperature and current through the heater, and an IRF 640 field-effect transistor, with a variable gate voltage, was used to control the current through the heater to vary the temperature of the substrate.

Subsequently, the chamber was evacuated and the e-beam was started. A picture was obtained at 1.5 kx magnification. The sample holder was heated with resistance heater to a temperature above ambient of approximately 40° C. and approximately 10° C. below the transition temperature around 45-50° C. of the TiNi. This was to enable the electron beam to bring the temperature through a relatively small temperature change to effect the phase transformation. The beam was centered approximately on the bent portion of the microbeam as indicated by reference arrow 10. It should be further appreciated that the amount of pre-heating energy applied influences the amount of power that must be applied by the focused beam—the lower the pre-heat temperature of the shape memory alloy, the more energy that must be applied by the beam.

The SEM beam aperture was opened to impart the maximum current to the specimen, using spot mode, and current in the e-beam was increased. Typical current used was in the range of 70 to 100 nano-amperes measured with a Kiethley picoammeter connected between the sample and ground potential. This current was applied to the sample for a time between 2 and 10 seconds, although other exposure times may be suitable. After exposure, the beam current was reduced and further pictures taken.

The resultant movement of the structure are shown in FIGS. 4a through 4c. In particular, image FIG. 4a shows the sample previous to heating. Images 4b and 4c, in turn, show the progressive actuation as successive parts of the device were heated by the electron beam. Approximately thirty degrees of recovery was achieved, although other levels may be possible depending upon the structure characteristics. Accordingly, the lever achieved in the experimental design is about 2 microns in diameter and 20 microns long.

As a result of the initial experiments, the micro-cantilever moving about thirty degrees from its original position was not due to thermal expansion as it did not reverse when the temperature was reduced. Thus, actuation of a micro-scale device by scanning electron beam was demonstrated, showing that the e-beam can provide enough energy to cause the phase transformation (and resultant movement) under controlled conditions.

Using such information, the present invention is directed toward a number of alternative embodiments. One such embodiment, depicted in FIGS. 5a and 5b, contemplates construction of a platform 18 and providing molecular and nano-level x-y motion using pairs of opposed bending cantilevers 20, so that partial actuation of one cantilever pushes the platform in the direction of the arrow while pre-straining the opposing cantilever. Similarly, it is believed that larger-scale, translational motion can be achieved with multiple actuators operating in sequence against a ratcheting or similar advancement mechanism.

In the electron microscope embodiment described herein, it is further contemplated as part of the invention, that the normal beam is used for both causing and observing movement of the memory alloy segment or structure. Moreover, a software or similar feedback loop may be implemented, perhaps providing wireless control of microrobotic systems. Analogous actions can be done in the optical and ultrasonic embodiments described below.

In an alternative to the e-beam embodiment described above, it is also contemplated that aspects of the present invention may be implemented using laser energy in an optical microscope. It will be appreciated by those skilled in the art that the concept is the same in both cases; a beam of energy focused on a shaped memory alloy segment will produce local heating of the segment, giving rise to movement.

In accordance with the embodiments described herein, SMA microactuators may be produced to provide the "muscles" of tiny robots that are fabricated by MEMS technology on silicon wafers. It will be further appreciated that such structures may be employed for fabricating other nanotechnology devices and elements, and particularly for moving a microscopic x-y stage. However, this invention is also applicable to nanotechnology where the nanoactuators are large molecules that are undergoing shape transformations as a result of interactions with focused beam energy such as photons, particle beams (such as electrons), or phonons (ultrasound).

In recapitulation, the present invention is a method and apparatus for the production and operation of microactuators by focused beam energy, and more particularly to a wireless technique for both control and energy, as well as the return path for observation and data.

It is, therefore, apparent that there has been provided, in accordance with the present invention, a method and apparatus for the creation and application of microactuators. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

What is claimed is:

1. A method for driving a shape memory alloy actuator, including the steps of:
   pre-straining a shape memory alloy in its low-temperature state to produce a shape memory actuator;
   subsequently, heating the shape memory alloy actuator above its phase transformation temperature using a focused beam so as to cause a first portion of the shape memory alloy actuator to move relative to a second portion; and
   observing movement of the actuator using the focused beam.

2. The method of claim 1, further including a software feedback loop, wherein said feedback loop provides wireless control of the shape memory alloy actuator.

3. The method of claim 1, wherein the focused beam is a photon beam.

4. The method of claim 1, wherein the focused beam is a phonon beam.

* * * * *